(12) United States Patent
Bathan et al.

(10) Patent No.: US 7,901,996 B2
(45) Date of Patent: *Mar. 8, 2011

(54) INTEGRATED CIRCUIT PACKAGE SYSTEM WITH INTERCONNECTION SUPPORT AND METHOD OF MANUFACTURE THEREOF

(75) Inventors: Henry Descalzo Bathan, Singapore (SG); Il Kwon Shim, Singapore (SG); Jeffrey D. Punzalan, Singapore (SG); Zigmund Ramirez Camacho, Singapore (SG)

(73) Assignee: Stats Chippac Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 12/484,131

(22) Filed: Jun. 12, 2009

(65) Prior Publication Data
US 2009/0250798 A1 Oct. 8, 2009

Related U.S. Application Data

(63) Continuation of application No. 11/456,532, filed on Jul. 10, 2006, now Pat. No. 7,563,647.

(60) Provisional application No. 60/595,712, filed on Jul. 29, 2005.

(51) Int. Cl.
*H01L 21/00* (2006.01)
*H01L 23/495* (2006.01)

(52) U.S. Cl. ......... 438/123; 257/672; 257/673; 257/786

(58) Field of Classification Search ..................... None
See application file for complete search history.

(56) References Cited

U.S. PATENT DOCUMENTS

| | | | |
|---|---|---|---|
| 5,214,307 A | 5/1993 | Davis | |
| 5,805,427 A | 9/1998 | Hoffman | |
| 6,423,623 B1 | 7/2002 | Bencuya et al. | |
| 6,504,238 B2 | 1/2003 | Cheng et al. | |
| 6,597,059 B1 | 7/2003 | McCann et al. | |
| 6,648,213 B1 | 11/2003 | Patterson et al. | |
| 6,798,667 B2 | 9/2004 | Chan | |
| 6,824,041 B2 | 11/2004 | Grieder et al. | |
| 6,858,919 B2 | 2/2005 | Seo et al. | |
| 7,038,311 B2 | 5/2006 | Woodall et al. | |
| 7,170,168 B2 | 1/2007 | Wu et al. | |
| 7,563,647 B2 * | 7/2009 | Bathan et al. ................. | 438/122 |
| 2003/0067057 A1 | 4/2003 | Wu | |
| 2006/0170082 A1 | 8/2006 | Tzu | |

FOREIGN PATENT DOCUMENTS

| | | |
|---|---|---|
| JP | 02237129 A | 9/1990 |
| JP | 08306853 A | 11/1996 |
| TW | 236758 B1 | 7/2005 |

* cited by examiner

*Primary Examiner* — Alonzo Chambliss
(74) *Attorney, Agent, or Firm* — Mikio Ishimaru

(57) ABSTRACT

An integrated circuit package system with interconnect support is provided including providing an integrated circuit, forming an electrical interconnect on the integrated circuit, forming a contact pad having a chip support, and coupling the integrated circuit to the contact pad by the electrical interconnect, with the integrated circuit on the chip support.

14 Claims, 10 Drawing Sheets

INTEGRATED CIRCUIT PACKAGE SYSTEM WITH INTERCONNECTION SUPPORT AND METHOD OF MANUFACTURE THEREOF

CROSS-REFERENCE TO RELATED APPLICATION

This application is a continuation of U.S. Non Provisional patent application Ser. No. 11/456,532 filed Jul. 10, 2006, which claims the benefit of U.S. Provisional Patent Application Ser. No. 60/595,712 filed Jul. 29, 2005, and the subject matter thereof is hereby incorporated herein by reference thereto.

TECHNICAL FIELD

The present invention relates generally to integrated circuit packaging, and more particularly to a system for packaging of flipchip integrated circuit die.

BACKGROUND ART

The integrated circuit has become indispensable in our daily life, including food, clothing, lodging, transportation, education, and entertainment. Product assembled using integrated circuit devices can be found everywhere. Sophisticated electronic products continue to be developed that are more user-friendly and have functions that are more complicated. In order to provide improving convenience and usage, product design trends are towards lighter, thinner, shorter, and smaller.

Higher integration can be achieved through chip scale package (CSP) applications such as flip chip technology. Flip chip technology can employ area arrays for bump pads including connections to a carrier, thereby reducing package area and shortening transmission paths. A flip chip is generally a semiconductor device, such as an integrated circuit, having bead-like terminals formed on one surface of the chip. The terminals serve to both secure the chip to a circuit board and electrically connect the flip chip's circuitry to a conductor pattern formed on the circuit board, which may be a ceramic substrate, printed wiring board, flexible circuit, or a silicon substrate. The typical flip chip is generally quite small, resulting in the terminals being crowded along the perimeter. As a result, conductor patterns are typically composed of numerous conductors often spaced closely.

Because of the fine patterns of the terminals and conductor pattern, soldering a flip chip to its conductor pattern requires a significant degree of precision. Reflow solder techniques are widely utilized in the soldering of flip chips. Such techniques typically involve forming solder bumps on the surface of the flip chip. Heating the solder above its melting temperature serves to form the characteristic solder bumps. The chip is then soldered to the conductor pattern by registering the solder bumps with their respective conductors, and reheating, or reflowing, the solder so as to metallurgically and electrically bond the chip to the conductor pattern.

Deposition and reflow of the solder must be precisely controlled not only to coincide with the spacing of the terminals and the size of the conductors, but also to control the height of the solder bumps after soldering. Controlling the height of solder bumps after reflow is necessary in order to provide proper positioning of the chip after reflow. Sufficient spacing between the chip and substrate is necessary for enabling stress relief during thermal cycles, providing electrical isolation, allowing cleaning solutions for removing undesirable residues during manufacturing, and enabling bonding and encapsulation materials between the chip and the substrate.

By properly limiting the degree to which the molten solder can laterally expand during reflow, the height of the solder bumps, and therefore the spacing between chip and substrate, can be closely controlled by depositing an appropriate amount of solder at each terminal location. Packaging processes are still plagued by conventional techniques that cannot closely control the height of a flip chip's solder bumps and suffer from excessive solder wetting, reduced collapse height, poor IC planarity, solder overflow and insufficient lead registration or locking.

Thus, a need still remains for an integrated circuit package system to provide improved package performance and manufacturing including control over solder bump reflow and package encapsulation. In view of the increasing demand for improved integrated circuits and particularly more functions in smaller products at lower costs, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package system with interconnect support including providing an integrated circuit, forming an electrical interconnect on the integrated circuit, forming a contact pad having a chip support, and coupling the integrated circuit to the contact pad by the electrical interconnect, with the integrated circuit on the chip support.

Certain embodiments of the invention have other aspects in addition to or in place of those mentioned above. The aspects will become apparent to those skilled in the art from a reading of the following detailed description when taken with reference to the accompanying drawings.

BRIEF DESCRIPTION OF THE DRAWINGS

FIG. 14 B is a cross-sectional view of the chip support 1302, taken along the cut line 14 B-14 B, of FIG. 14 A;

FIG. 14 C is a bottom view of a chip support, in an alternative embodiment, having a recess;

BEST MODE FOR CARRYING OUT THE INVENTION

Figure 1:
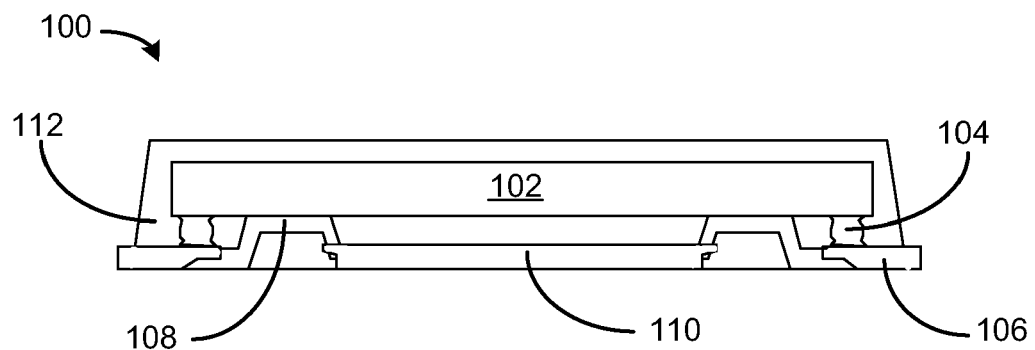
FIG. 1 is a cross-sectional view of an integrated circuit package system with interconnect support, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. The same numbers are used in all the drawing FIGS. to relate to the same elements.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" means the method and the apparatus of the present invention. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package system with interconnect support 100 with interconnect support, in an embodiment of the present invention. The cross-sectional view of the integrated circuit package system with interconnect support 100 includes an integrated circuit 102 having the electrical interconnects 104, such as solder balls, solder columns, stud bumps, or the like. The integrated circuit 102, such as a flipchip integrated circuit, is mounted on a lead frame having contact pads 106, a chip support 108 and a paddle 110. The integrated circuit 102 rests on the chip support 108 during the reflow process. The chip support 108 provides sufficient clearance between the integrated circuit 102 and the contact pads 106 to prevent the collapse of the electrical interconnects 104. An epoxy molding compound 112 encapsulates the integrated circuit 102, the electrical interconnects 104, the chip support 108, the surface of the paddle 110 and the surface of the contact pads 106.

Figure 2:
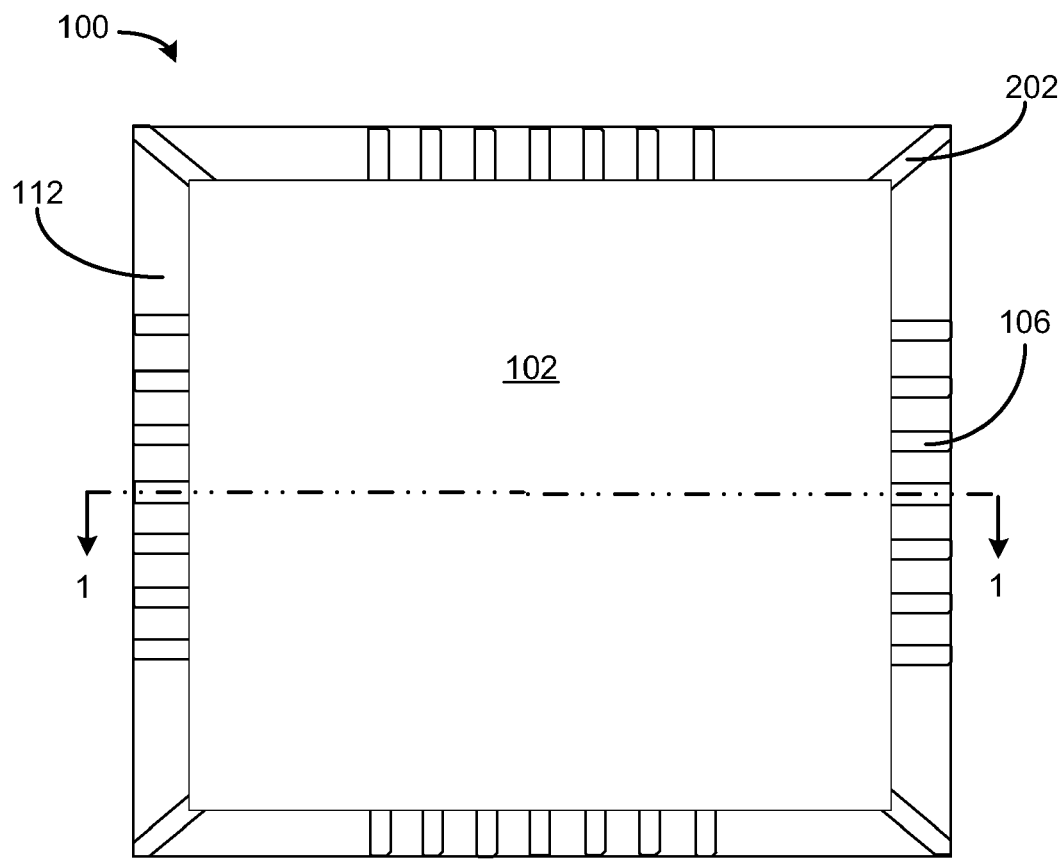
FIG. 2 is a top view of the integrated circuit package system with interconnect support, of FIG. 1, with the upper epoxy molding compound removed.

Referring now to FIG. 2, therein is shown a top view of the integrated circuit package system with interconnect support 100 with interconnect support, of FIG. 1, with the epoxy molding compound 112 on the upper portion removed. The top view of the integrated circuit package system with interconnect support 100 depicts the integrated circuit 102 mounted within an array of the contact pads 106. A cut line 1-1 indicates where the view of FIG. 1 was taken. A tie bar 202 runs diagonally under the integrated circuit 102 and provides corner stability. The epoxy molding compound 112 holds the structure of the package in place and protects the electrical interconnects 104, of FIG. 1.

Figure 3:
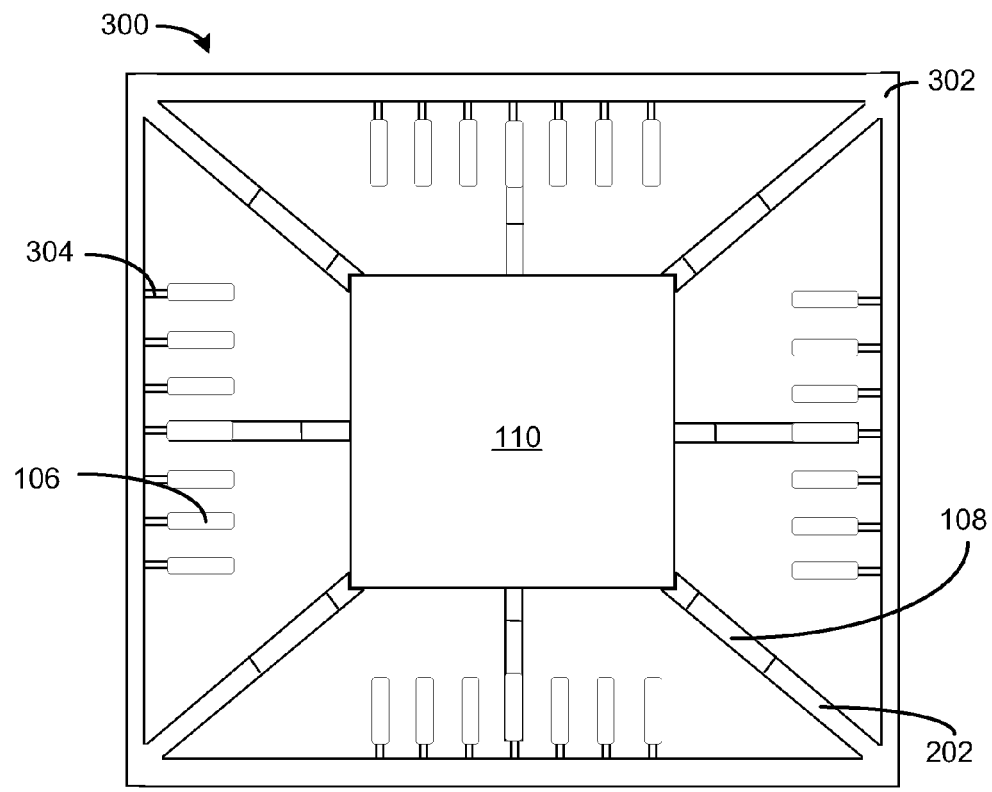
FIG. 3 is a top view of a leadframe, of FIG. 2.

Referring now to FIG. 3, therein is shown a top view of a leadframe 300, of FIG. 2. The top view of the leadframe 300 depicts an outer frame 302 with contact tabs 304, such as half etched metal. The leadframe 300 is punched or forged from a sheet of metal, such as copper, tin or another conductive material. The contact tabs 304 support the contact pads 106. One of the contact pads 106 on each side of the leadframe 300 may be coupled to the chip support 108 and further couple to the paddle 110. This combination is known as fused leads, since all of the contact pads 106 are electrically connected through the paddle 110.

The tie bar 202 has the chip support 108 and also connects to the paddle 110. The tie bar 202 does not involve using any of the contact pads 106 and is therefore a preferred configuration. Since the tie bar 202 emanates from each corner of the leadframe 300, they represent a stable platform for the integrated circuit 102, of FIG. 1, during the reflow process.

Figure 4:
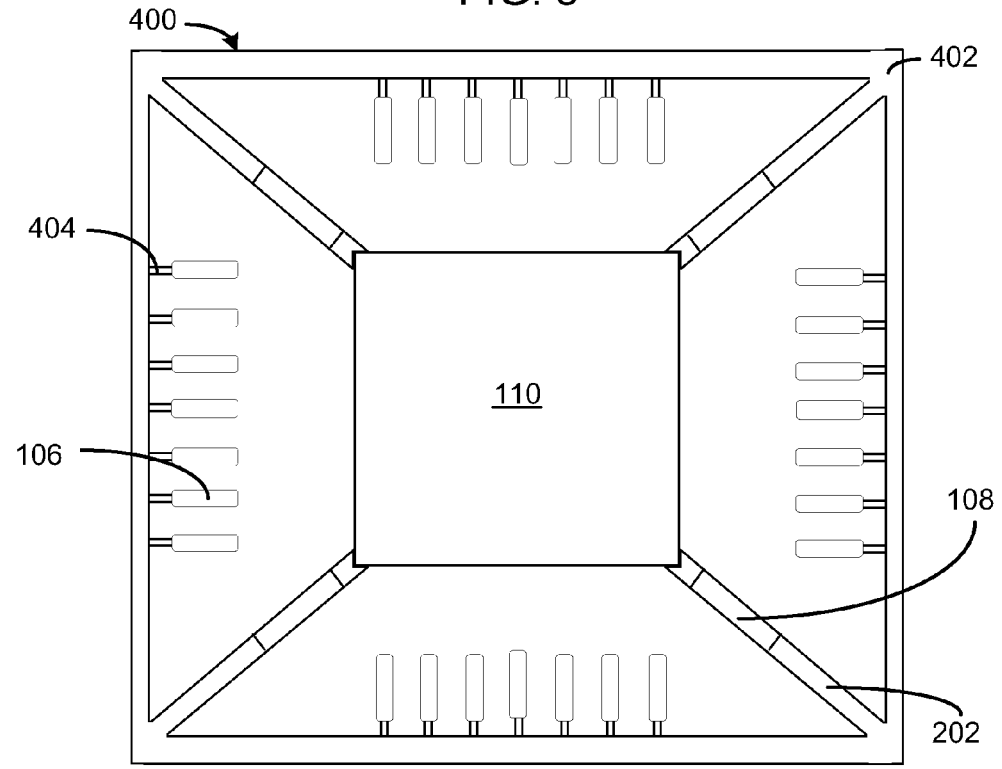
FIG. 4 is a top view of an alternative leadframe for the integrated circuit package system with interconnect support, in an alternative embodiment of the present invention.

Referring now to FIG. 4, therein is shown a top view of an alternative leadframe 400 for the integrated circuit package system with interconnect support 100, in an alternative embodiment of the present invention. The top view of the alternative leadframe 400 depicts an outer frame 402 with contact tabs 404, such as half etched metal. The alternative leadframe 400 is punched or forged from a sheet of metal, such as copper, tin or another conductive material. The contact tabs 404 support the contact pads 106. The tie bar 202, which supports the paddle 110, has the chip support 108 located proximate the paddle 110.

Figure 5:
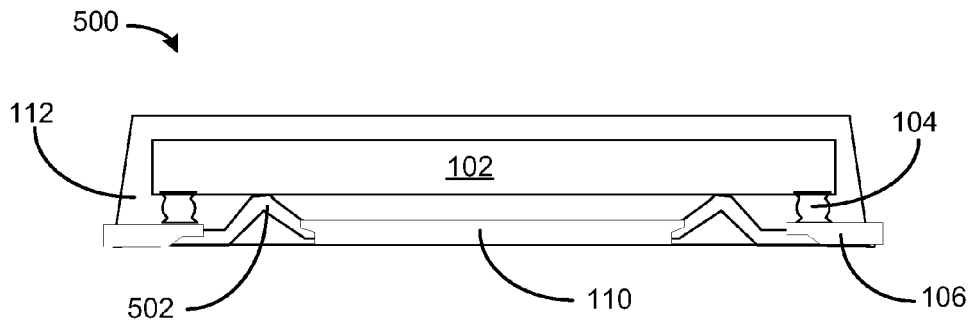
FIG. 5 is a cross-sectional view of the integrated circuit package system with interconnect support, in a second alternative embodiment of the present invention.

Referring now to FIG. 5, therein is shown a cross-sectional view of an integrated circuit package system with interconnect support 500, in a second alternative embodiment of the present invention. The cross-sectional view of the integrated circuit package system with interconnect support 500 depicts the integrated circuit 102 having the electrical interconnects 104 coupled to the contact pads 106. A chip support 502 couples the contact pads 106 to the paddle 110 in a fused contact configuration. The chip support 502 contacts the integrated circuit 102 substantially midway between the electrical interconnects 104 and the paddle 110. This position may be useful to reduce the parasitic capacitance near the electrical interconnects 104.

Figure 6:
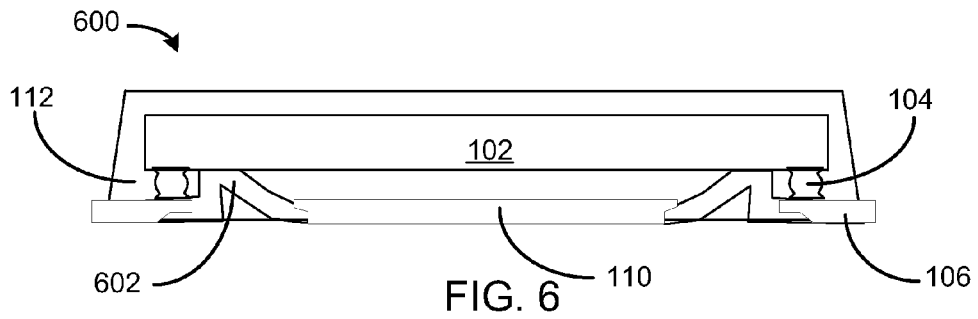
FIG. 6 is a cross-sectional view of the integrated circuit package system with interconnect support, in a third alternative embodiment of the present invention.

Referring now to FIG. 6, therein is shown a cross-sectional view of the integrated circuit package system with interconnect support 600, in a third alternative embodiment of the present invention. The cross-sectional view of the integrated circuit package system with interconnect support 600 depicts the integrated circuit 102 having the electrical interconnects 104 coupled to the contact pads 106. A chip support 602 couples the contact pads 106 to the paddle 110 in a fused contact configuration. The chip support 602 contacts the integrated circuit 102 substantially adjacent to the electrical interconnects 104. This position may be useful in order to add parasitic capacitance to the signal path. The chip support 602 may also provide a thermal path to the paddle 110 allowing better thermal performance of the integrated circuit package system with interconnect support 600.

Figure 7:
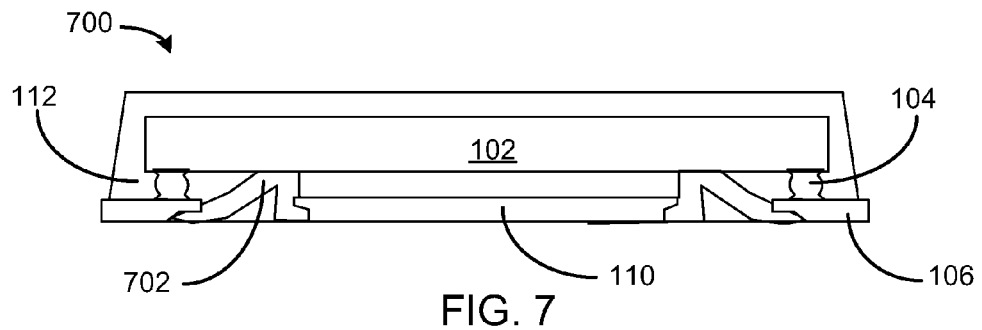
FIG. 7 is a cross-sectional view of the integrated circuit package system with interconnect support, in a fourth alternative embodiment of the present invention.

Referring now to FIG. 7, therein is shown a cross-sectional view of an integrated circuit package system with interconnect support 700, in a fourth alternative embodiment of the present invention. The cross-sectional view of the integrated circuit package system with interconnect support 700 depicts the integrated circuit 102 having the electrical interconnects 104 coupled to the contact pads 106. A chip support 702 couples the contact pads 106 to the paddle 110 in a fused contact configuration. The chip support 702 contacts the integrated circuit 102 substantially adjacent to the paddle 110. This position may be useful in order to add parasitic capacitance to the signal path. The chip support 702 may also provide a thermal path to the paddle 110 allowing better thermal performance of the integrated circuit package system 700.

Figure 8:
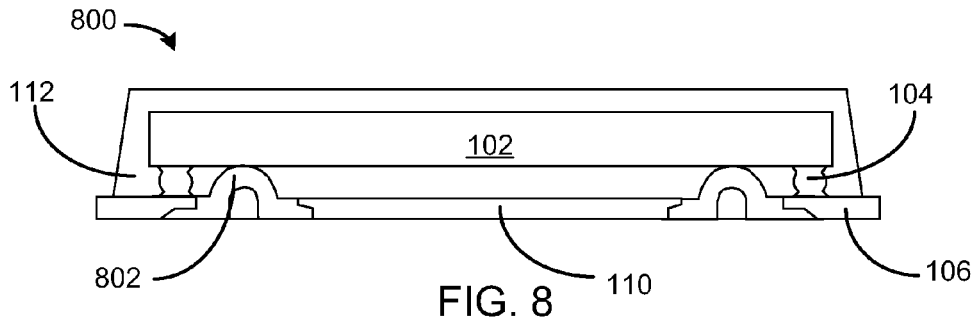
FIG. 8 is a cross-sectional view of the integrated circuit package system with interconnect support, in a fifth alternative embodiment of the present invention.

Referring now to FIG. 8, therein is shown a cross-sectional view of an integrated circuit package system with interconnect support 800, in a fifth alternative embodiment of the present invention. The cross-sectional view of the integrated circuit package system with interconnect support 800 depicts the integrated circuit 102 having the electrical interconnects 104 coupled to the contact pads 106. A chip support 802 couples the contact pads 106 to the paddle 110 in a fused contact configuration. The chip support 802 contacts the integrated circuit 102 substantially midway between the electrical interconnects 104 and the paddle 110. This position may be useful to reduce the parasitic capacitance near the electrical interconnects 104. The chip support 802 has a rounded contour which may substantially reduce the contact surface area with the integrated circuit 102.

Figure 9:
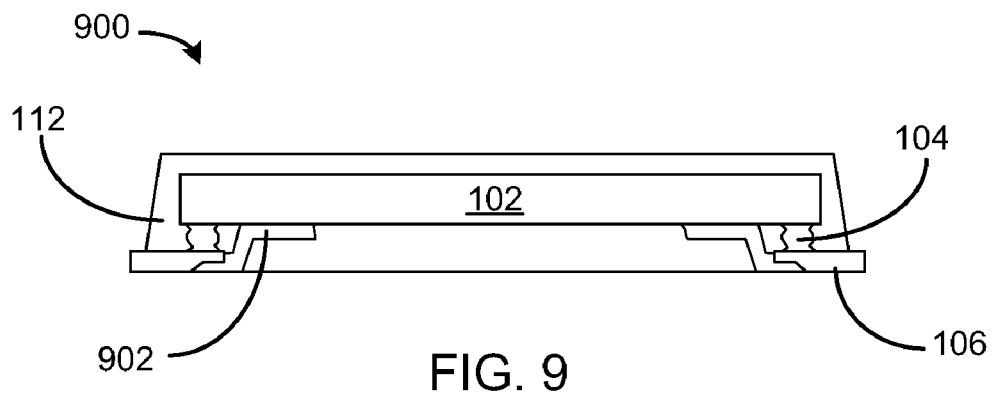
FIG. 9 is a cross-sectional view of the integrated circuit package system with interconnect support, in a sixth alternative embodiment of the present invention.

Referring now to FIG. 9, therein is shown a cross-sectional view of an integrated circuit package system with interconnect support 900, in a sixth alternative embodiment of the present invention. The cross-sectional view of the integrated circuit package system with interconnect support 900 depicts the integrated circuit 102 having the electrical interconnects 104 coupled to the contact pads 106. A chip support 902 extends from one of the contact pads 106 on each side of the integrated circuit package system with interconnect support 900. By placing the chip support 902, on the integrated circuit 102, adjacent to the electrical interconnects 104, there is no need to have the tie bar 202 or the paddle 110. During the reflow process, the integrated circuit 102 is lowered onto the chip support 902. The chip support 902 then prevents the further collapse of the electrical interconnects 104.

Figure 10:
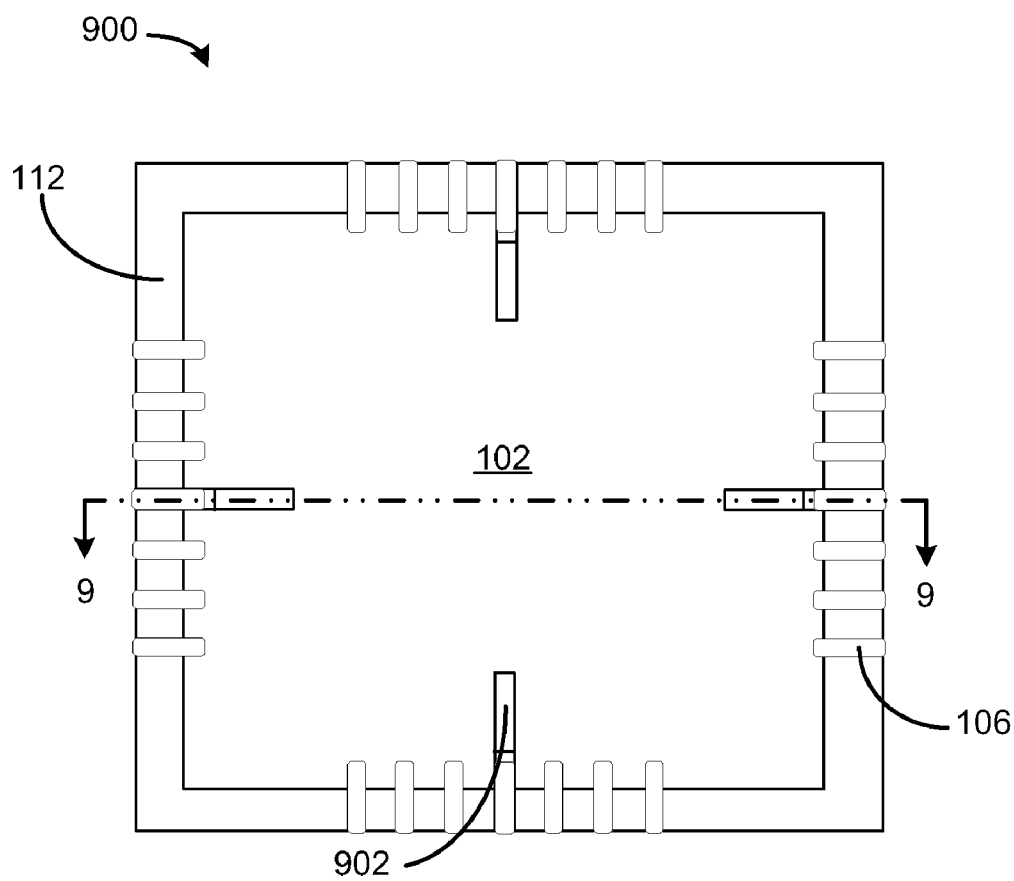
FIG. 10 is a bottom view of the integrated circuit package system with interconnect support, of FIG. 9.

Referring now to FIG. 10, therein is shown a bottom view of the integrated circuit package system with interconnect support 900, of FIG. 9. The bottom view of the integrated circuit package system with interconnect support 900 depicts several of the contact pads 106 aligned around the outer edges of the integrated circuit package system with interconnect support 900. The chip support 902 extends from the contact pads 106 located in the center of each side. The integrated circuit 102 rests on the chip support 902 after the reflow process. The structure of the chip support 902 prevents the collapse of the electrical interconnects, thus eliminating solder contamination of the outer leads and solder bridging. The epoxy molding compound 112 holds the integrated circuit 102 and the contact pads 106 in place. The cut line 9-9 indicates the view represented in FIG. 9.

Figure 11:
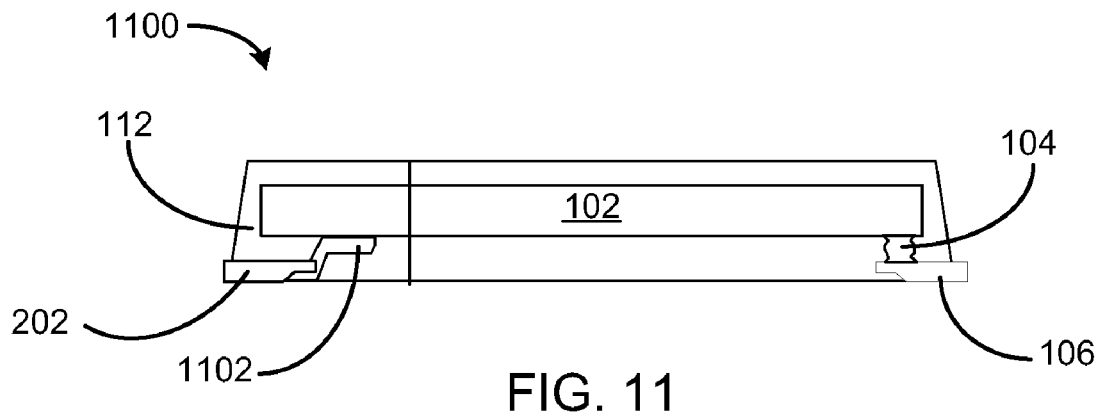
FIG. 11 is a cross-sectional view of the integrated circuit package system with interconnect support, in a seventh alternative embodiment of the present invention.

Referring now to FIG. 11, therein is shown a cross-sectional view of an integrated circuit package system with interconnect support 1100, in a seventh alternative embodiment of the present invention. The cross-sectional view of the integrated circuit package system with interconnect support 1100 depicts the integrated circuit 102 coupled to the contact pads 106 by the electrical interconnects 104. The integrated circuit 102 is on a chip support 1102 that extends from the tie bar 202. The epoxy molding compound 112 encapsulates the integrated circuit 102, the electrical interconnects 104, the contact pads 106, the tie bar 202, and the chip support 1102.

Figure 12:
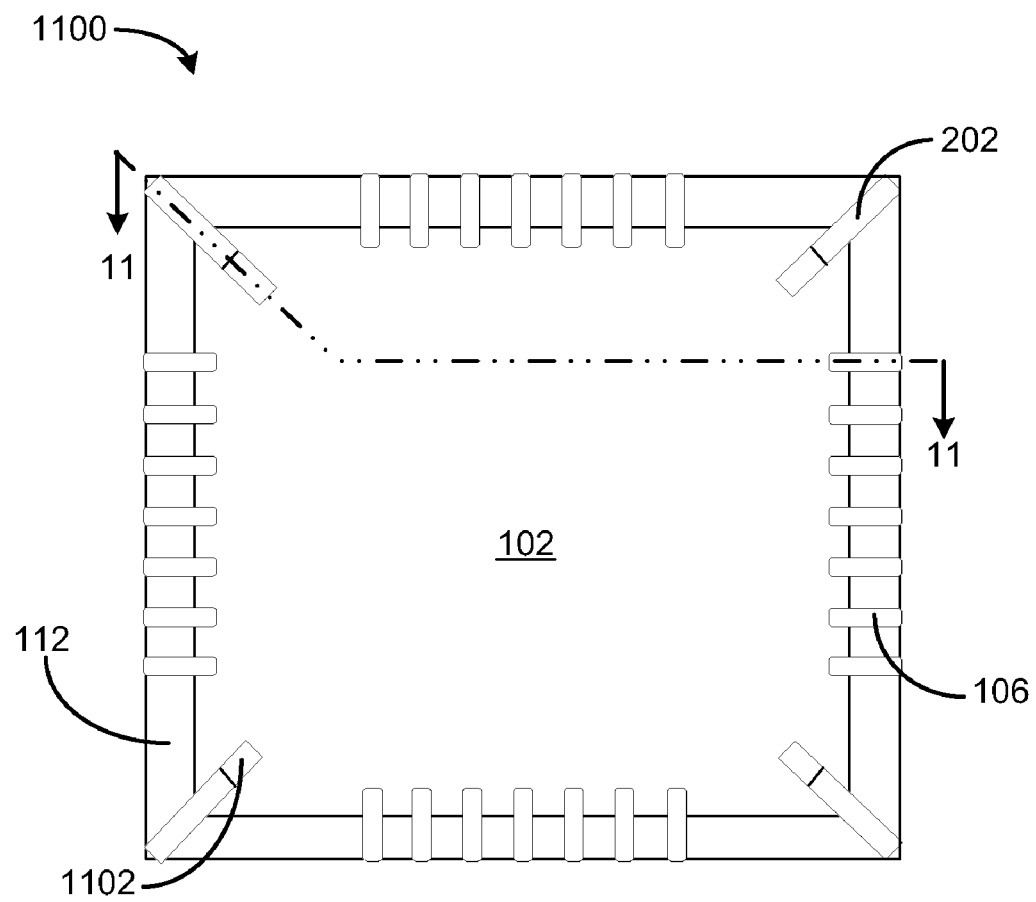
FIG. 12 is a bottom view of the integrated circuit package system with interconnect support, in the seventh alternative embodiment of the present invention.

Referring now to FIG. 12, therein is shown a bottom view of the integrated circuit package system with interconnect support 1100, in the seventh alternative embodiment of the present invention. The bottom view of the integrated circuit package system with interconnect support 1100 depicts the cut line 11-11, which starts on a diagonal through the tie bar 202 and the chip support 1102, then turns to cut through the contact pads 106. After the reflow process, the integrated circuit 102 rests on the chip support 1102, positioned near the corner of the integrated circuit 102 die. The epoxy molding compound 112 encapsulates the integrated circuit 102, the contact pads 106, the tie bar 202, and the chip support 1102.

Figure 13:
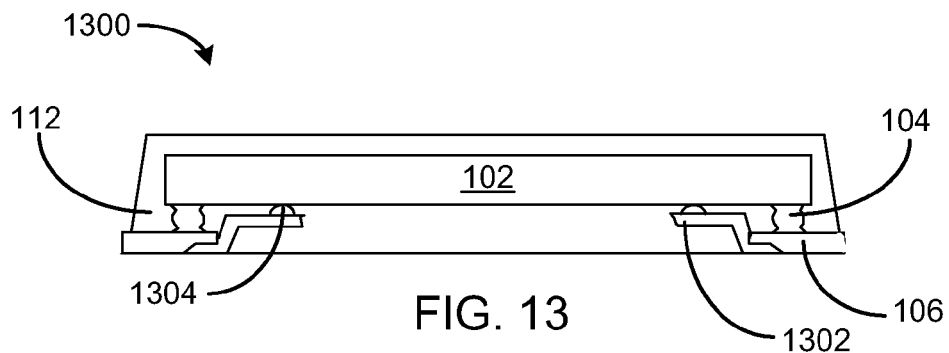
FIG. 13 is a cross-sectional view of an integrated circuit package system with interconnect support, in an eighth embodiment of the present invention.

Referring now to FIG. 13, therein is shown a cross-sectional view of an integrated circuit package system with interconnect support 1300, in an eighth embodiment of the present invention. The cross-sectional view of the integrated circuit package system with interconnect support 1300 depicts the integrated circuit 102 having the electrical interconnects 104 coupled to the contact pads 106. A chip support 1302 extends from one of the contact pads 106 on each side of the integrated circuit package system with interconnect support 1300. The chip support 1302 has a protuberance 1304 on the upper surface. The protuberance 1304 may be a hemispherical, a cone, a pyramid shape, or any other shape that limits the contact area on the integrated circuit 102. The protuberance 1304 is shown near the end of the chip support 1302, but it is understood that it may be positioned on any structure beneath the integrated circuit 102.

Figure 14:
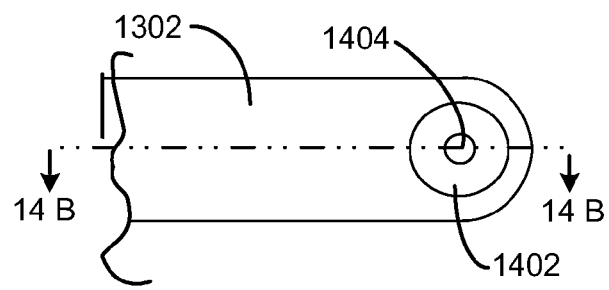
FIG. 14 A is a bottom view of a chip support having a protuberance.
Figure 14:
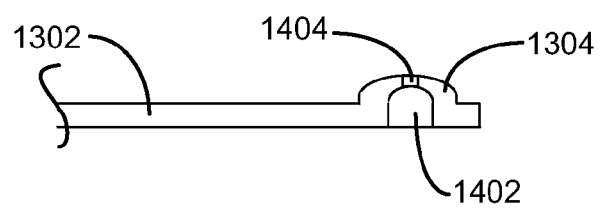
Figure 14:
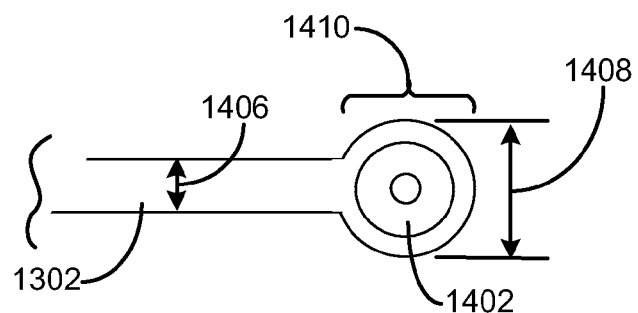

Referring now to FIG. 14 A, therein is shown is a bottom view of the chip support 1302 having a recess 1402. The bottom view of the chip support 1302 depicts the recess 1402, such as a circular, cylindrical, conical, or pyramid-like recess, with a pass through 1404. The pass through 1404 is an optional feature and is intended to minimize the contact area between the protuberance 1304, of FIG. 13, and the integrated circuit 102, of FIG. 1. A cut line 14 B-14 B indicates the placement for the cross-sectional view of FIG. 14 B.

Referring now to FIG. 14 B, therein is shown a cross-sectional view of the chip support 1302, taken along the cut line 14 B-14 B, of FIG. 14 A. The cross-sectional view of the chip support 1302 depicts the protuberance 1304 with the recess 1402 and the pass through 1404. The pass through 1404 allows a path for the epoxy molding compound 112, of FIG. 1, to displace air that may be captured in the recess 1402 during the molding process. The protuberance 1304 may be forged, molded, punched or adhered on the chip support 1302. For illustrative purposes, the protuberance 1304 is shown near the edge of the chip support 1302, but it is understood that the protuberance 1304 may be positioned at any location beneath the integrated circuit 102, of FIG. 1. Further, the pass through 1404 is an optional feature and the protuberance 1304 may be formed without it.

Referring now to FIG. 14 C, therein is shown a bottom view of the chip support 1302, in an alternative embodiment, having the recess 1402. The bottom view of the chip support 1302 depicts the alternative construction of the chip support 1302, wherein a first width 1406 of the chip support 1302 is narrower than a second width 1408 of a recess area 1410. The position of the recess area 1410 is for example only and the recess area 1410 may be positioned on the tie bar 202, of FIG. 2, on the paddle 110, of FIG. 1, or any structure that is beneath the integrated circuit 102, of FIG. 1.

Figure 15:
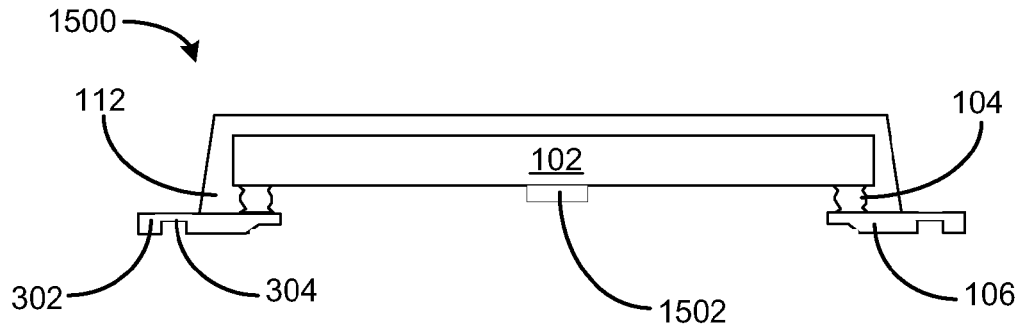
FIG. 15 is a cross-sectional view of an integrated circuit package system with interconnect support, in a ninth embodiment of the present invention.

Referring now to FIG. 15, therein is shown a cross-sectional view of an integrated circuit package system with interconnect support 1500, in a ninth embodiment of the present invention. The cross-sectional view of the integrated circuit package system with interconnect support 1500 depicts the integrated circuit 102 having the electrical interconnects 104 coupled to the contact pads 106. The contact pads 106 are supported by the contact tabs 304, of FIG. 3, and the outer frame 302, of FIG. 3. An elevated paddle 1502, formed by the tie bar 202 bent upward, provides support for the integrated circuit 102 during the reflow process. As the electrical interconnects 104 deform due to the reflow process, the integrated circuit 102 is lowered onto the elevated paddle 1502, which provides support for the integrated circuit 102 and prevents any further collapse of the electrical interconnects.

Figure 16:
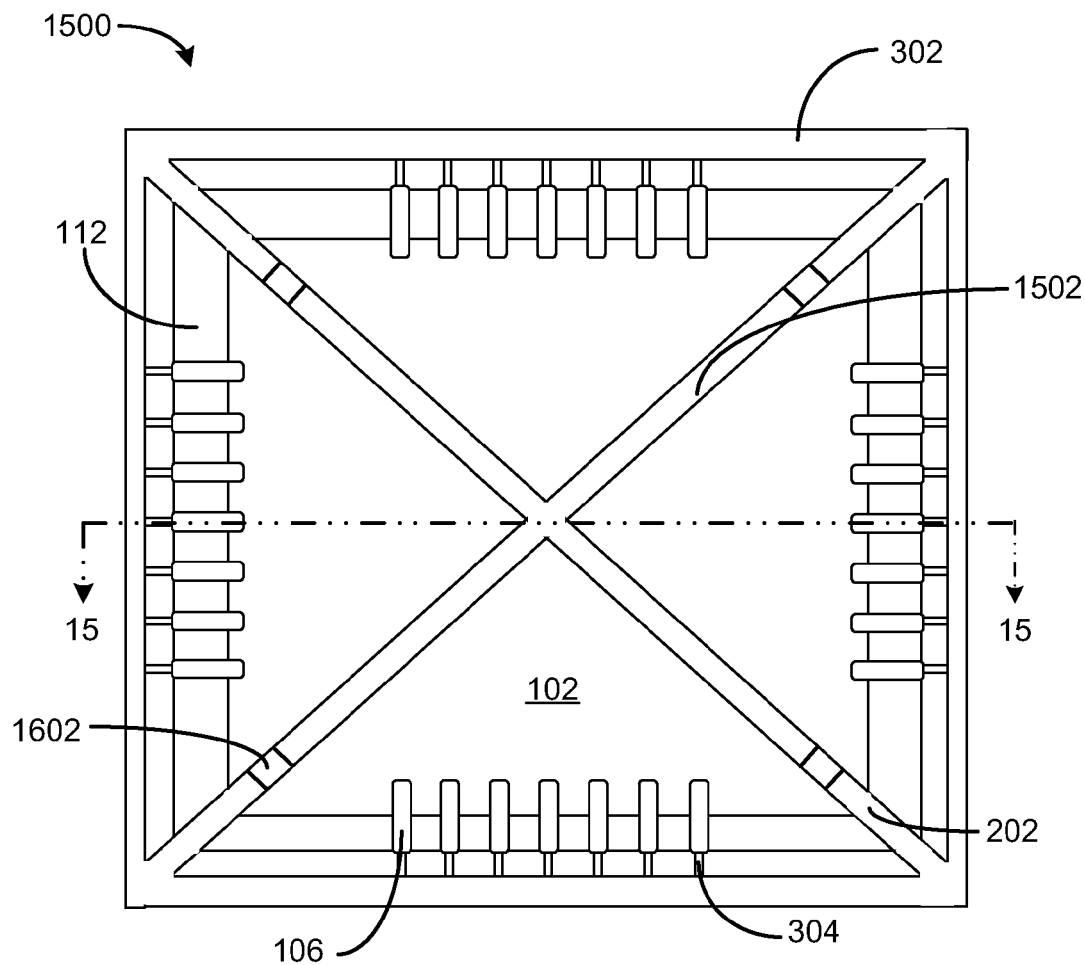
FIG. 16 is a bottom view of the integrated circuit package system with interconnect support, using the tie bar for the elevated paddle.

Referring now to FIG. 16, therein is shown a bottom view of the integrated circuit package system with interconnect support 1500, using the tie bar 202 for the elevated paddle 1502. The bottom view of the integrated circuit package system with interconnect support 1500 depicts the outer frame 302 having the tie bar 202 and the contact tabs 304, which supports the contact pads 106. The tie bar 202 has a bend region 1602 the transitions the tie bar 202 into the elevated paddle 1502. The integrated circuit 102 rests on the elevated paddle 1502 after the reflow process has deformed the electrical interconnects 104, of FIG. 1.

Figure 17:
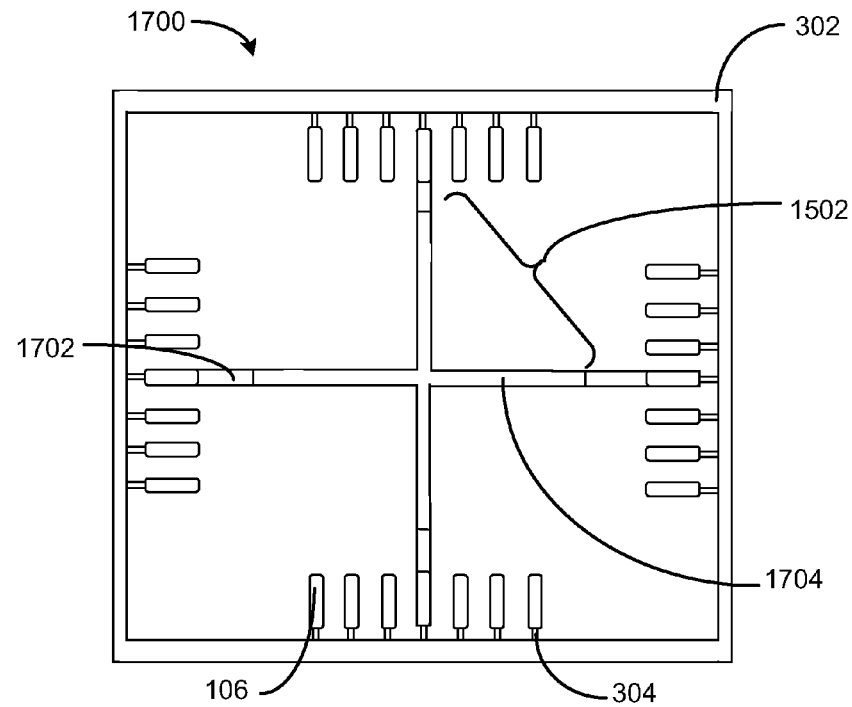
FIG. 17 is a bottom view of a leadframe for the integrated circuit package system with interconnect support, using fused leads for the elevated paddle.

Referring now to FIG. 17, therein is shown a bottom view of a leadframe 1700 for the integrated circuit package system with interconnect support 1500, using fused leads 1704 for the elevated paddle 1502. The bottom view of the leadframe 1700 depicts the outer frame 302 having the contact tabs 304, which supports the contact pads 106. The center of each side of the leadframe 1700 has the contact pads 106 coupled to a bent segment 1702, which couples the fused leads 1704 in the position of the elevated paddle 1502. The elevated paddle 1502 acts as a support for the integrated circuit 102, of FIG. 1, during the reflow process. As the electrical interconnects 104, of FIG. 1, start to deform the integrated circuit 102 rests on the elevated paddle 1502. The support of the elevated paddle 1502 prevents further collapse of the electrical interconnects 104.

Figure 18:
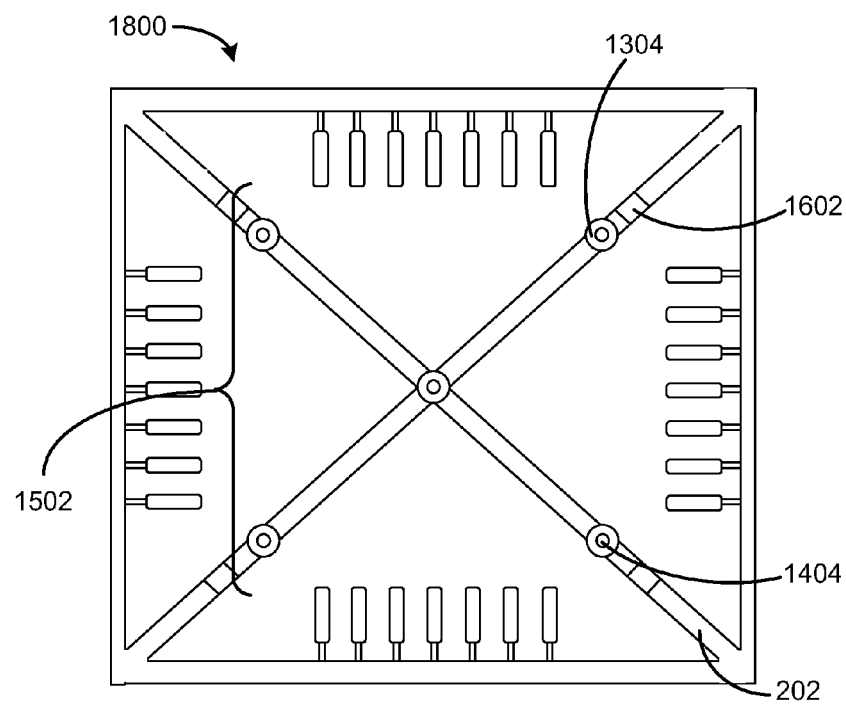
FIG. 18 is a top view of a leadframe for the integrated circuit package system with interconnect support, using the tie bar for the elevated paddle with the protuberance.

Referring now to FIG. 18 therein is shown a top view of a leadframe 1800 for the integrated circuit package system with interconnect support 1500, using the tie bar 202 for the elevated paddle 1502 with the protuberance 1304. The top view of the leadframe 1800 depicts the elevated paddle 1502 formed on the tie bar 202, having the protuberance 1304 on each segment near the bend region 1602 and one of the protuberance 1304 at the vertex of the elevated paddle 1502. The protuberance 1304 is shown with the pass through 1404, of FIG. 14 B, though the pass through 1404 is optional and may be omitted. The addition of the protuberance 1304 provides a way to level the integrated circuit 102, of FIG. 1, while minimizing the contact area between the leadframe 1800 and the integrated circuit 102.

Figure 19:
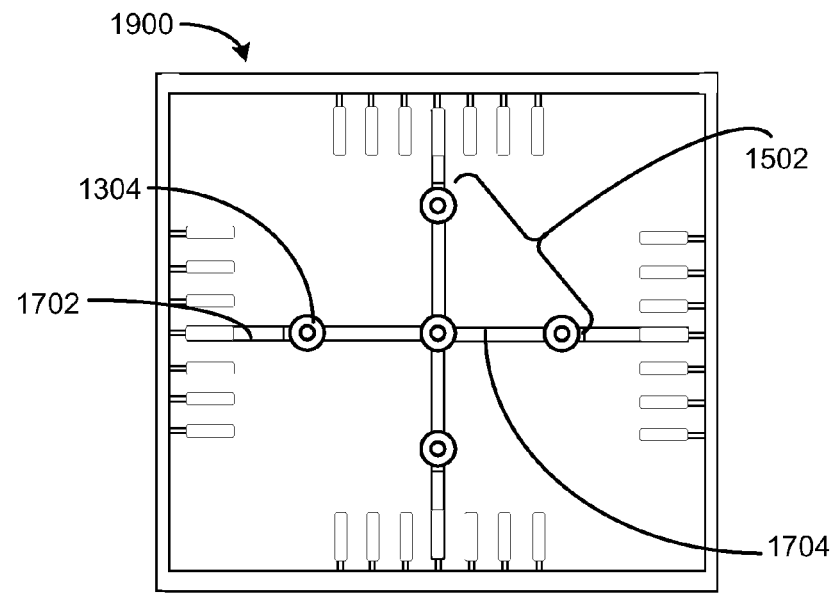
FIG. 19 is a top view of a leadframe for the integrated circuit package system with interconnect support, using fused leads for the elevated paddle, with the protuberance.

Referring to FIG. 19, therein is shown a top view of a leadframe 1900 for the integrated circuit package system with interconnect support 1500, using the fused leads 1704 for the elevated paddle 1502, with the protuberance 1304. The top view of the leadframe 1900 depicts the bent segment 1702 coupled to the fused leads 1704. The protuberance 1304 is positioned on the fused leads near the bent segment 1702 and at the vertex of the fused leads 1704. The combination of the fused leads and the protuberance 1304 forms the elevated paddle 1502.

Figure 20:
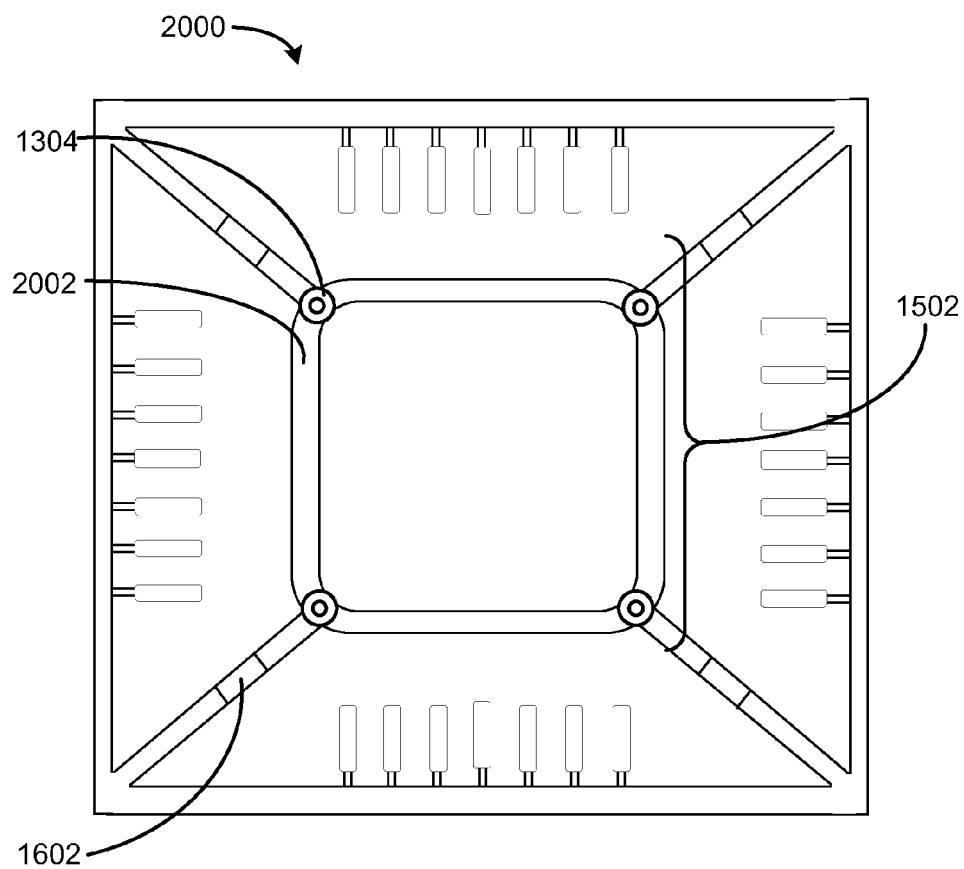
FIG. 20 is a top view of a leadframe for the integrated circuit package system with interconnect support, using a ring support for the elevated paddle, with the protuberance.

Referring to FIG. 20, therein is shown a top view of a leadframe 2000 for the integrated circuit package system with interconnect support 1500, having the elevated paddle 1502, with the protuberance 1304. The top view of the leadframe 2000 depicts the elevated paddle 1502 comprising a ring support 2002 elevated on the bend region 1602 with the protuberance 1304 optionally formed at the tie points of the ring support 2002. The ring support 2002 may be used without the protuberance 1304 formed at the tie points, if the contact area is not a concern.

Figure 21:
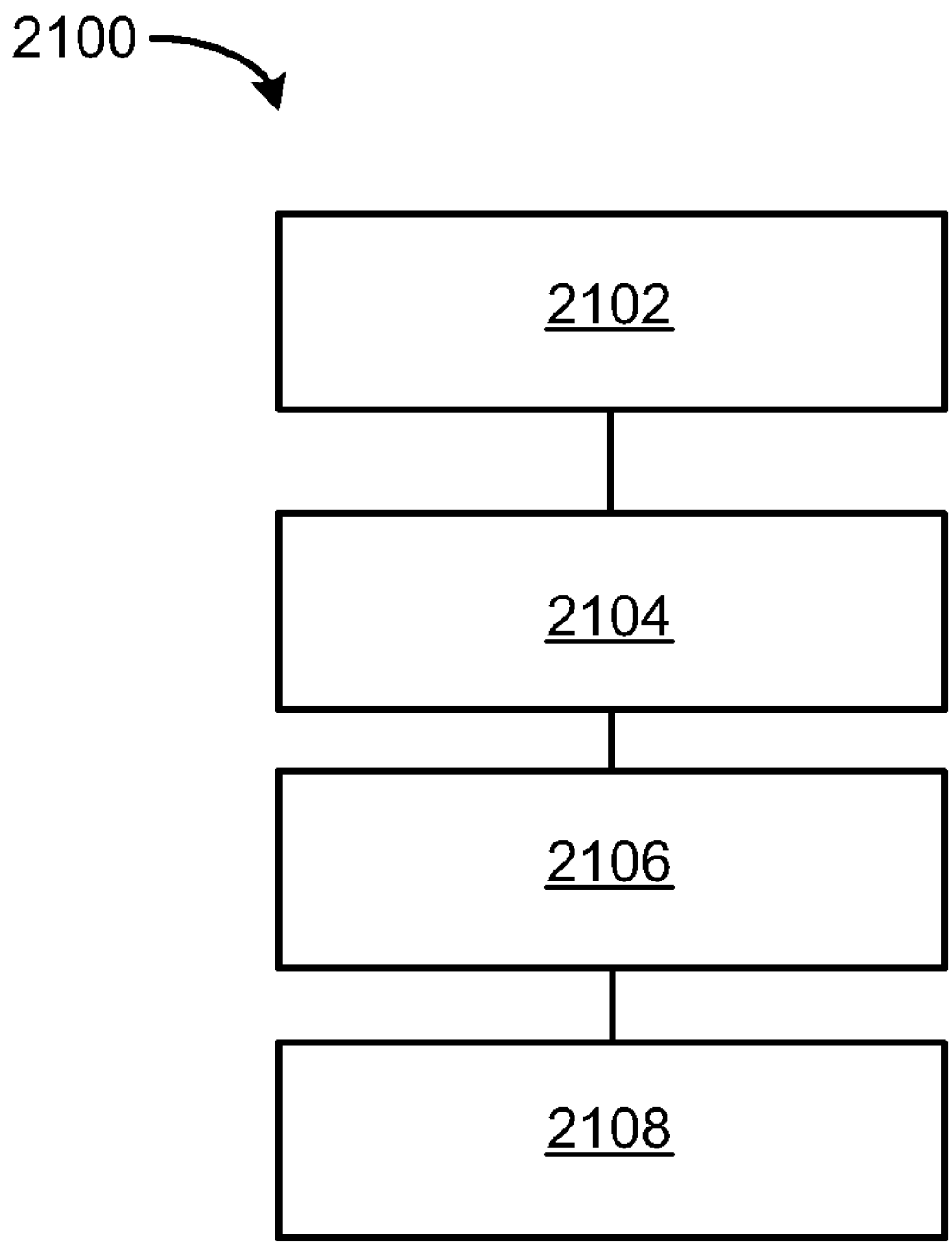
FIG. 21 is a flow chart of an integrated circuit package system with interconnect support for manufacturing the integrated circuit package system with interconnect support, in an embodiment of the present invention.

Referring now to FIG. 21, therein is shown a flow chart of an integrated circuit package system with interconnect support 2100 for manufacturing the integrated circuit package system with interconnect support 100 in an embodiment of the present invention. The system 2100 includes providing an integrated circuit in a block 2102; providing forming an electrical interconnect on the integrated circuit in a block 2104; forming a contact pad having a chip support in a block 2106; and coupling the integrated circuit to the contact pad by the electrical interconnect, with the integrated circuit on the chip support in a block 2108.

It has been discovered that the present invention thus has numerous aspects.

A principle aspect that has been unexpectedly discovered is that the present invention provides better chip planarity by regulation of the solder wetting and the collapse height.

Another aspect is present invention regulates solder contamination on the outer lead surface, and reduces solder bridging.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system with interconnect support of the present invention furnishes important and heretofore unknown and unavailable solutions, capabilities, and functional aspects for packaging flip-chip QLP packages. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package system with interconnect support comprising:
   providing an integrated circuit;
   forming an electrical interconnect on the integrated circuit;
   forming a lead frame having a contact pad and a chip support; and
   coupling the integrated circuit to the contact pad by the electrical interconnect, with the integrated circuit on the chip support.

2. The method as claimed in claim 1 further comprising forming an elevated paddle for supporting the integrated circuit.

3. The method as claimed in claim 1 further comprising:
   forming a protuberance on the chip support; and
   providing an epoxy molding compound for encapsulating the integrated circuit, the protuberance and the chip support.

4. A method of manufacturing an integrated circuit package system with interconnect support comprising:
   providing an integrated circuit;
   forming an electrical interconnect on the integrated circuit, includes forming solder balls, solder columns or stud bumps on the integrated circuit;
   forming a lead frame having a contact pad and a chip support with the chip support under the integrated circuit; and
   coupling the integrated circuit to the contact pad by the electrical interconnect, with the integrated circuit on the chip support, includes using a reflow process for lowering the integrated circuit onto the chip support.

5. The method as claimed in claim 4 further comprising forming an elevated paddle for supporting the integrated circuit includes forming a bend region between the contact pad and the elevated paddle.

6. The method as claimed in claim 4 further comprising:
   forming a protuberance on the chip support includes forming a hemisphere, a cone or a pyramid on the chip support; and
   providing an epoxy molding compound for encapsulating the integrated circuit, the protuberance and the chip support, includes encapsulating the electrical interconnects.

7. An integrated circuit package system with interconnect support comprising:
   an integrated circuit;
   an electrical interconnect formed on the integrated circuit;
   a lead frame having a contact pad and a chip support; and
   the integrated circuit coupled to the contact pad by the electrical interconnect, with the integrated circuit on the chip support.

8. The system as claimed in claim 7 further comprising an elevated paddle for supporting the integrated circuit.

9. The system as claimed in claim 7 further comprising:
   a protuberance on the chip support; and
   an epoxy molding compound for encapsulating the integrated circuit, the protuberance and the chip support.

10. The system as claimed in claim 7 in which the electrical interconnects include solder balls, solder columns or stud bumps.

11. The system as claimed in claim 10 further comprising an elevated paddle for supporting the integrated circuit includes a bend region between the contact pad and the elevated paddle.

12. The system as claimed in claim 10 further comprising:
    a protuberance on the chip support includes a hemisphere, a cone or a pyramid on the chip support; and
    an epoxy molding compound for encapsulating the integrated circuit, the protuberance and the chip support, includes the electrical interconnects encapsulated.

13. The system as claimed in claim 10 further comprising a fused lead, a tie bar, or a combination thereof with a protuberance on the structure for leveling the integrated circuit includes a contact area minimized between the protuberance and the integrated circuit.

14. The system as claimed in claim 10 further comprising a ring support elevated from a bend region, includes the bend region coupled to a tie bar.

* * * * *